United States Patent [19]

Onodera

[11] Patent Number: 5,579,322
[45] Date of Patent: Nov. 26, 1996

[54] DUAL PORT MEMORY HAVING TESTING CIRCUIT

[75] Inventor: Takeshi Onodera, Kanagawa, Japan

[73] Assignee: Sony Corporation, Japan

[21] Appl. No.: 295,439

[22] Filed: Aug. 25, 1994

[30] Foreign Application Priority Data

Sep. 2, 1993 [JP] Japan .................................. 5-243863

[51] Int. Cl.$^6$ ............................ G01R 15/12; G11C 29/00
[52] U.S. Cl. ........................ 371/22.3; 371/21.1; 371/21.3
[58] Field of Search ................................. 371/21.3, 22.3, 371/22.5, 21.1, 25; 324/73 R, 158 R; 365/201

[56] References Cited

U.S. PATENT DOCUMENTS

| | | | |
|---|---|---|---|
| 3,961,252 | 6/1976 | Eichelberger | 324/73 |
| 5,040,150 | 8/1991 | Naitoh et al. | 365/201 |
| 5,222,067 | 6/1993 | Hiroshi | 371/21.3 |

OTHER PUBLICATIONS

Conference Paper; Built–in Self Test in Multi–Post RAMS Castro, A. V.; Nicolaidis, M; Lestrat, P; Courtois, B. 1991 IEEE International Conference on Computer aided Design pp. 248–251.

"Built–in self test for Multi–port Rams" by V. Castro Alves, M. Nicolaidis, P. Lestrat and B. Courtois.

Primary Examiner—Robert W. Beausoliel
Assistant Examiner—Nadeem Iqbal
Attorney, Agent, or Firm—Ronald P. Kananen

[57] ABSTRACT

An object of the present invention is to provide an embedded testing circuit of a dual port memory capable of effectively testing the memory using a short test pattern while making simultaneous write/read from both of the ports.

The testing circuit comprises an address inputting circuit selectively supplying M-sequence pattern data or their inverted pattern data to scan registers on the port A at the address input side and also selectively supplying pattern data in inverse relationship to the pattern data supplied to the port A to scan registers on the port B and a data inputting circuit selectively supplying the M-sequence pattern data or their inverted pattern data passed through the scan registers on the port A at the address input side to scan registers on the port A at the data input side and also selectively supplying the inverted pattern data or the M-sequence pattern data passed through the scan registers on the port B at the address input side to scan registers on the port B at the data input side.

8 Claims, 6 Drawing Sheets

| 0001001101011110000 | A(i) | i |
|---|---|---|
| 0000 | 0 | 0 |
| 1000 | 8 | 1 |
| 1100 | 12 | 2 |
| 1110 | 14 | 3 |
| 1111 | 15 | 4 |
| 0111 | 7 | 5 |
| 1011 | 11 | 6 |
| 0101 | 5 | 7 |
| 1010 | 10 | 8 |
| 1101 | 13 | 9 |
| 0110 | 6 | 10 |
| 0011 | 3 | 11 |
| 1001 | 9 | 12 |
| 0100 | 4 | 13 |
| 0010 | 2 | 14 |
| 0001 | 1 | 15 |

DUAL PORT MEMORY HAVING TESTING CIRCUIT

BACKGROUND OF THE INVENTION

The present invention relates to an embedded testing circuit of a dual port memory and, more particularly, to a testing circuit embedded in a semiconductor integrated circuit together with a dual port memory for testing the memory.

Figure 1:
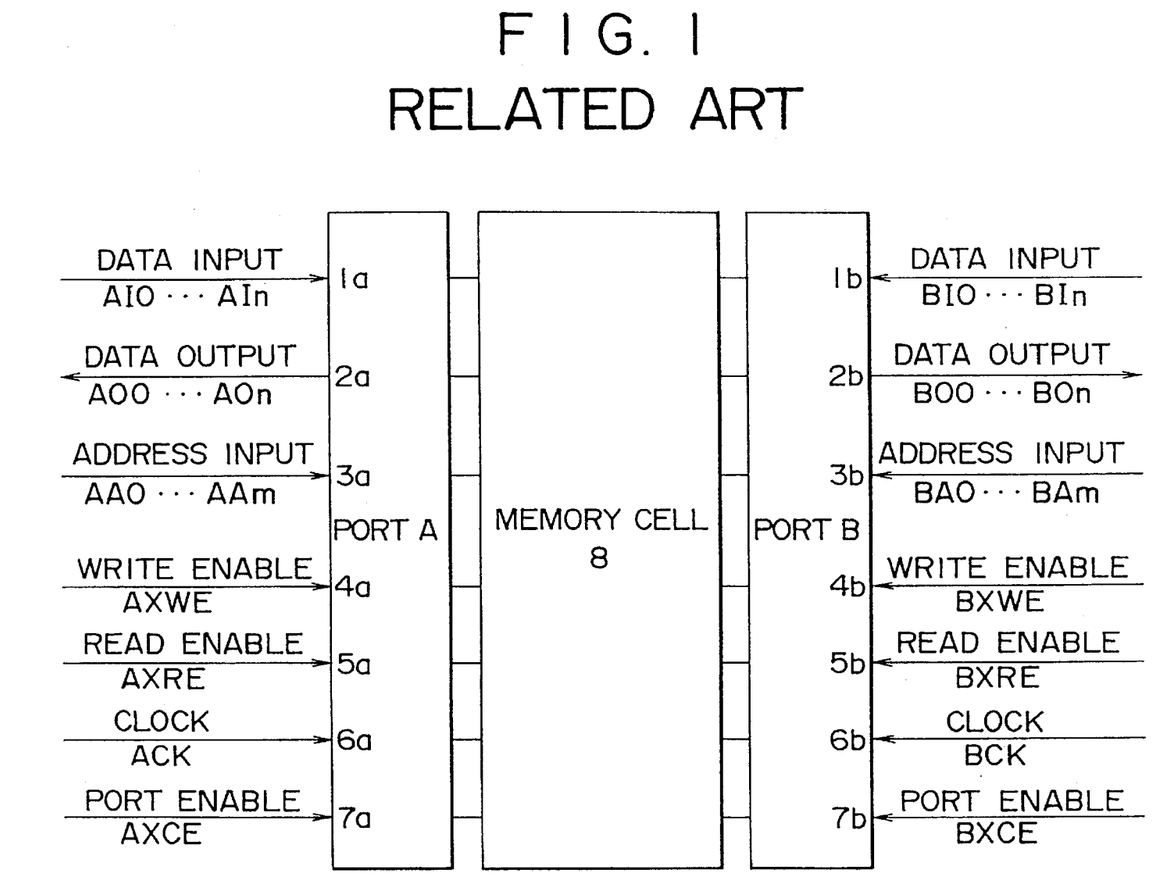
FIG. 1 is a diagram schematically showing structure of a dual port RAM as a related art.

In a dual port memory, for example in a dual port RAM having two systems each of address inputs 3a, 3b (AA0 ... AAm, BA0 ... BAm), data inputs 1a, 1b (AI0 ... AIn, BI0 ... BIn), and data outputs 2a, 2b (AO0 ... AOn, BO0 ... BOn), as shown in FIG. 1, the ports A and B are adapted to operate independently. However, it is prohibited to write different values to the same address from both of the ports.

As to the test of such a dual port RAM, it may be simply considered enough if read and write can be made from both of the ports A and B. However, a test to simultaneously read or write from both the ports is indispensable for checking specifications and analog behavior of the memory.

Figure 2:
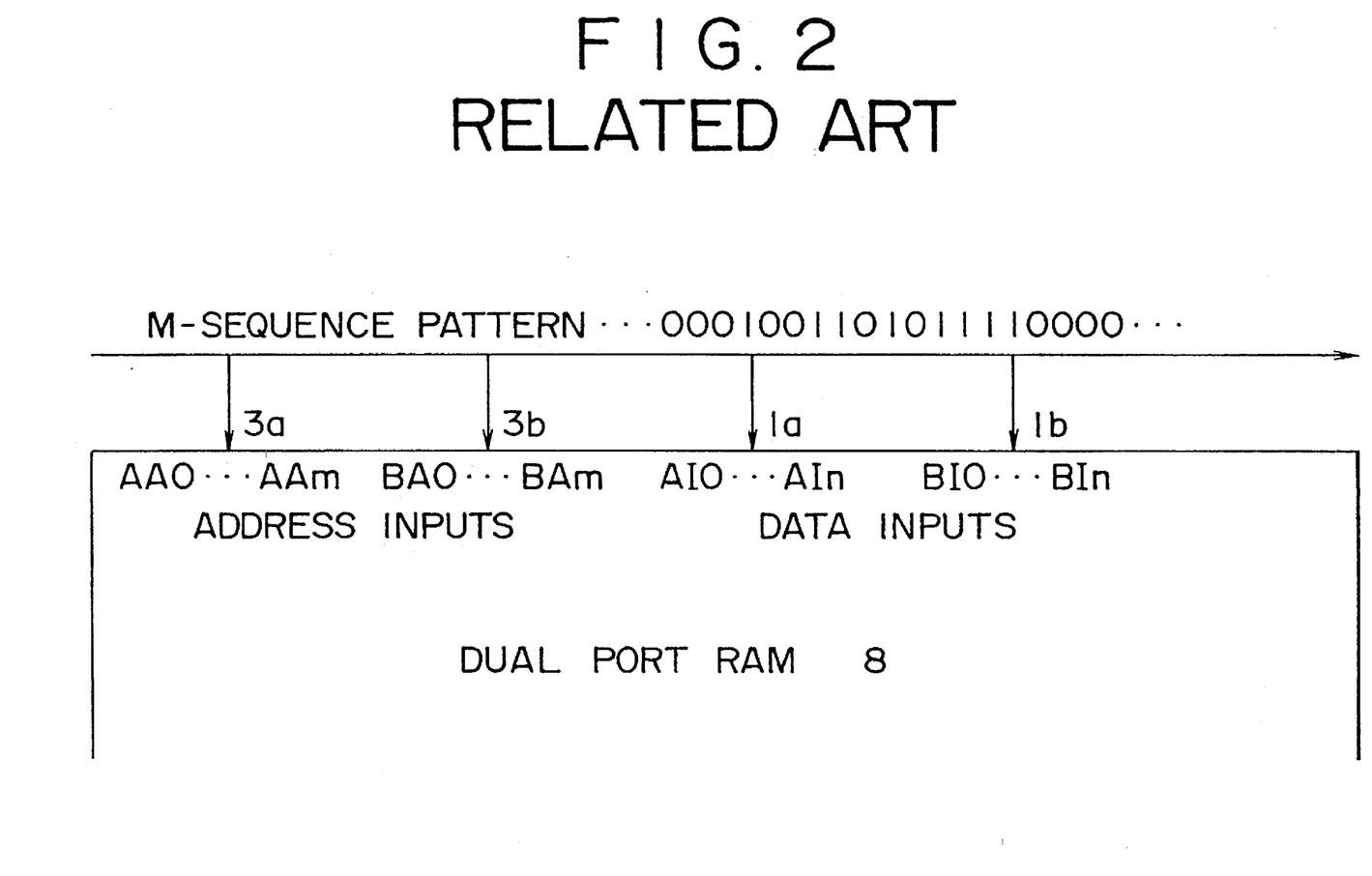
FIG. 2 is a diagram showing a state of inputs to a dual port RAM as a related art.

In a test of a dual port RAM, if a conventional test circuit of a single port RAM, in which a pattern of M-sequence (maximum length linearly recurring sequence) as it is is employed as the test pattern, is applied to the dual port RAM, then, it occurs that the M-sequence pattern is input to the address inputs 3a, 3b (AA0 ... AAm, BA0 ... BAm) and data inputs 1a, 1b (AI0 ... AIn, BI0 ... BIn) being sequentially shifted as shown in FIG. 2.

In that case, since the number of degrees of the M-sequence is determined by the maximum address space of ROM/RAM within the chip, it is not always assured that the number of degrees is matching with the address inputs to the RAM. Accordingly, in a write cycle, inputting to the same address from both the ports A and B can take place. Hence, the conventional means as it is cannot be employed.

Further, supposing that the M-sequence pattern is employed, if attention is paid to a specific memory cell, the following situations arise:

(1) the order of writing, i.e., whether data is written first from the port A and then from the port B or in the other way, cannot be controlled; and (2) while it is confirmed that data "1" can be written from the port B only when the data "1" is written from the port B after data "0" has been written from the port A, it is not assured that data are input in such sequence. Thus, there has been a problem that a sufficient test of a dual port RAM cannot be made by applying only the conventional test as it is to the dual port RAM.

Figure 3:
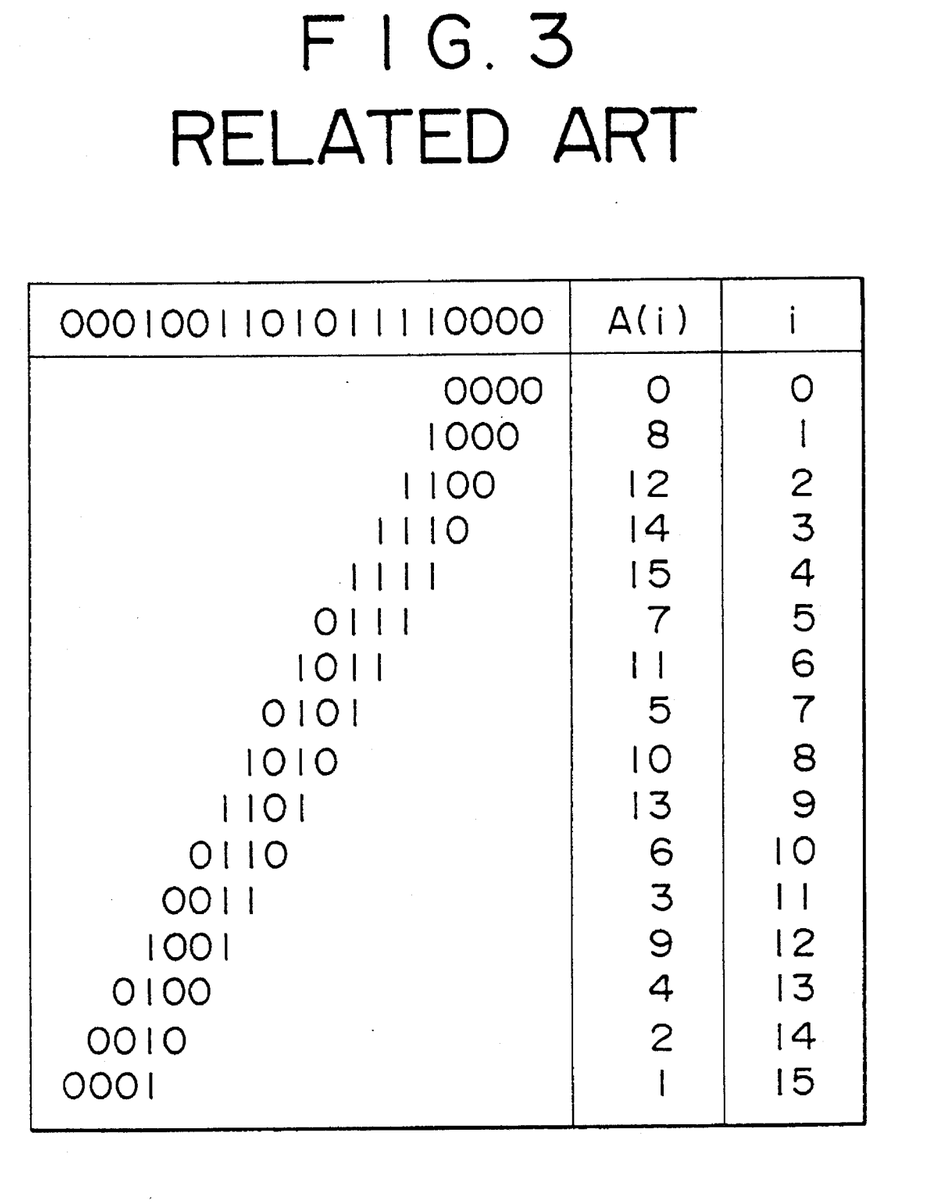
FIG. 3 is a diagram showing four-degree M-sequence signals used for testing a dual port RAM.

In the M-sequence, when it is of a degree of n in general, the continuing binary values of n bits are all different, i.e., all the values from 0 to $2^n-1$ can be provided. An instance of 4-degree M-sequence signals is shown in FIG. 3. Here, i represents integers from 0 to 15, and A(i) corresponding to the integer i, represented by A(0) to A(15), indicates the data corresponding to A(i) (the M-sequence pattern). As apparent from FIG. 3, the binary values of continuing 4 bits in this sequence are all different, i.e., they provide all the values from 0 to 15.

OBJECT AND SUMMARY OF THE INVENTION

An object of the invention is to provide an embedded testing circuit of a dual port memory capable of making an effective test of the memory by performing simultaneous write/read from both the ports using a short test pattern.

An embedded testing circuit according to the invention is a testing circuit embedded in a semiconductor integrated circuit together with a dual port memory for testing the memory and it comprises a first group of scan registers formed of serially connected plural stages of scan registers provided on each port at the address input side of the dual port memory corresponding to each node, an address inputting circuit for selectively supplying predetermined pattern data or their inverted pattern data to one port side of the first group of scan registers and the inverted pattern data or the predetermined pattern data to the other port side of the first group of scan registers, a second group of scan registers formed of serially connected plural stages of scan registers provided on each port at the data input side of the dual port memory corresponding to each node, and a data inputting circuit for selectively supplying the predetermined pattern data or the inverted pattern data passed through the one port side of the first group of scan registers to the one port side of the second group of scan registers and selectively supplying, in a random data mode, the inverted pattern data or the predetermined pattern data passed through the other port side of the first group of scan registers, and, in a checkerboard mode, the predetermined pattern data or the inverted pattern data passed through the other port side of the first group of scan registers, to the other port side of the second group of scan registers.

In the embedded testing circuit of the described structure, the address inputting circuit selectively supplies predetermined pattern data or their inverted pattern data to the group of scan registers on the port A at the address input side and also selectively supplies the inverted pattern data or the predetermined pattern data to the group of scan registers on the port B.

Accordingly, the address inputs to both of the ports A and B are always held in a bit-inverse relationship to each other and, hence, the address inputs to both of the ports A and B do not become the same. Further, since it can be controlled to which of the side of the port A or the side of the port B the inverted pattern data will be supplied, the address inputs to both the port A and the port B can be controlled or presumed.

Further, the data inputting circuit selectively supplies predetermined pattern data or their inverted pattern data passed through the group of scan registers on the port A at the address input side to the group of scan registers on the port A at the data input side.

Furthermore, the data inputting circuit, in a random data mode, selectively supplies the inverted pattern data or the predetermined pattern data passed through the group of scan registers on the port B at the address input side, and, in a checkerboard mode, selectively supplies the predetermined pattern data or the inverted pattern data passed through the group of scan registers on the port B at the address input side, to the group of scan registers on the port B at the data input side.

Thereby, in the random data mode, the data written from the port A and the data written from the port B are always held in inverse relationship to each other. Accordingly, by switching over the address input and the data input, it is made possible to write and read "0" and "1" to and from all addresses from both of the ports A and B.

Further, in the checkerboard mode, the same data can be written from the port A and the port B. In consequence, it is made possible to write and read checkerboard pattern data to and from all of the address space regardless of the order of writing.

Table 1 shows data on ports A and B when a 4-degree M-sequence signal is shifted.

Table 2 shows data obtained by rearranging the data shown in Table 1 with the addresses taken as the reference.

Table 3 shows order of writing between the ports.

Table 4 shows input data to the ports A and B in each mode.

Table 5 shows test sequence in each test mode.

DETAILED DESCRIPTION OF THE PREFERRED EMBODIMENTS

Embodiments of the invention will be described below in detail with reference to the accompanying drawings.

Figure 4:
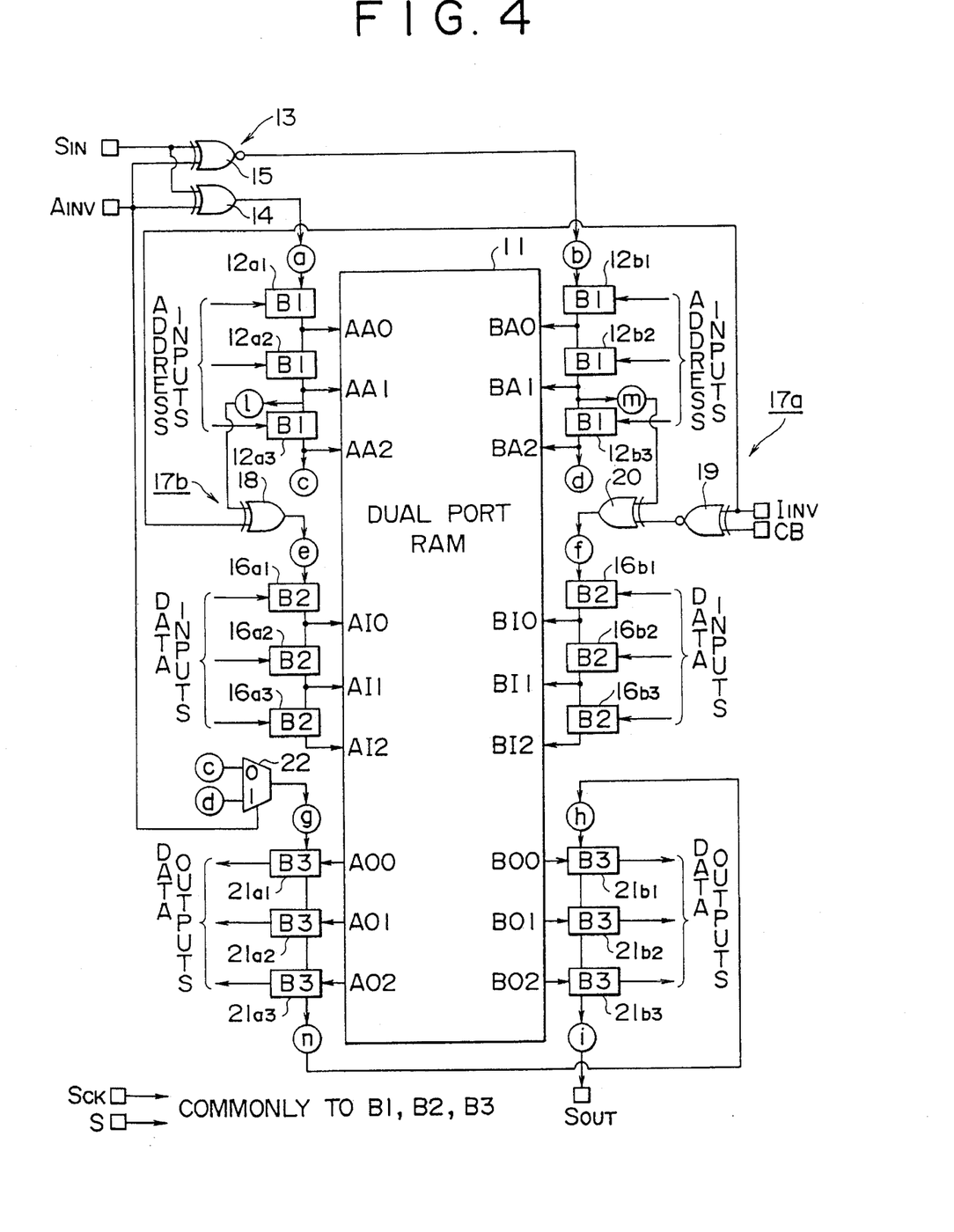
FIG. 4 is a block diagram showing a dual port RAM indicating a first embodiment of the invention.

FIG. 4 is a block diagram showing a first embodiment of the invention.

Referring to FIG. 4, at the address input side of the port A of the dual port RAM 11, there are arranged for example three, serially connected scan registers (B1) $12_{a1}$–$12_{a3}$ as a first group of scan registers corresponding to the input node, and the outputs Of the scan registers (B1) $12_{a1}$–$12_{a3}$ provide the address inputs AA0–AA2, respectively, on the port A of the dual port RAM 11.

Likewise, at the address input side of the port B, there are arranged for example three serially connected scan registers (B1) $12_{b1}$–$12_{b3}$ as the first group of scan registers corresponding to the input node, and the outputs of the scan registers (B1) $12_{b1}$–$12_{b3}$ provide the address inputs BA0–BA2, respectively, on the port B of the dual port RAM 11.

Figure 5:
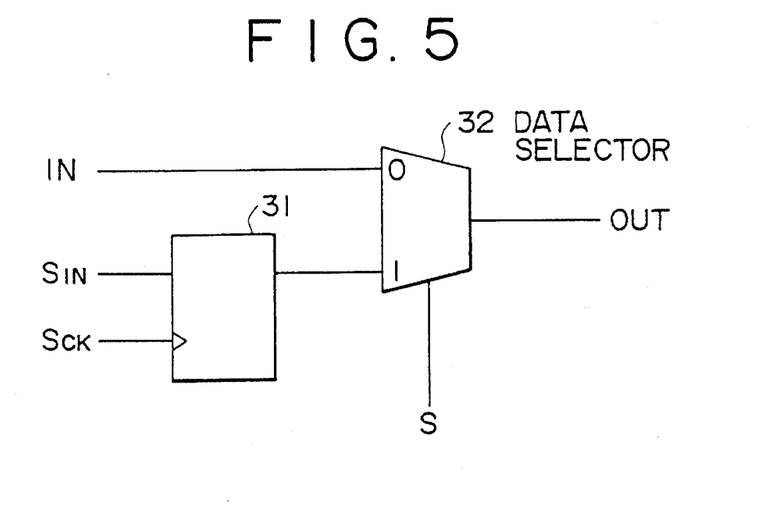
FIG. 5 is a block diagram showing an example of a particular structure of a scan register (B1) for use in a dual port RAM as a second embodiment of the invention.

The scan registers (B1) $12_{a1}$–$12_{a3}$, $12_{b1}$–$12_{b3}$ are each made up, as shown in FIG. 5, of a flip-flop 31 latching a scan input $S_{IN}$ in synchronism with a shift clock $S_{CK}$ and a selector 32 selecting either the scan input $S_{IN}$ latched by the flip-flop 31 or the address input IN in accordance with an operation mode established on the basis of a select signal S. In a normal operation mode (S=0), they select the data of the address input IN, which serves as address inputs AA0–AA2, BA0–BA2 on the ports A and B of the dual port RAM 11.

On the other hand, in a test operation mode (S =1), the scan registers $12_{a1}$–$12_{a3}$, $12_{b1}$–$12_{b3}$ function as a series of shift registers, which sequentially shifts M-sequence pattern data or their inverted pattern data input, as the scan input $S_{IN}$, through the address inputting circuit 13.

The address inputting circuit 13 is made up of an EX-OR (exclusive-OR) gate 14 receiving the scan input $S_{IN}$ and an address inverting signal $A_{INV}$ as two inputs thereto and an EX-NOR (exclusive-NOR) gate 15 similarly receiving the scan input $S_{IN}$ and the address inverting signal $A_{INV}$ as two inputs thereto.

In the address inputting circuit 13, the EX-OR gate 14, when the address inverting signal $A_{INV}$ is a logical "0" (hereinafter briefly referred to as "0"), functions as a buffer outputting the M-Sequence pattern data as it is as the scan input $S_{IN}$ and, when the address inverting signal $A_{INV}$ is a logical "1" (hereinafter briefly referred to as "1"), functions as an inverter outputting inverted data of the M-sequence pattern data.

On the other hand, the EX-NOR gate 15, when the address inverting signal $A_{INV}$ is "0", functions as an inverter outputting inverted data of the M-sequence pattern data and, when the address inverting signal $A_{INV}$ is "1", functions as a buffer outputting the M-sequence pattern data as it is.

It therefore follows that pattern data which are in the bit-inverse relationship to each other are input to the scan registers $12_{a1}$–$12_{a3}$ of the port A and the scan registers $12_{b1}$–$12_{b3}$ of the port B.

By having the M-sequence pattern data and their inverted pattern data sequentially shifted by the scan registers $12_{a1}$–$12_{a3}$, $12_{b1}$–$12_{b3}$, all addresses can be finally designated to the address inputs to both the ports A and B and, by writing to and reading from the dual port RAM 11 at each shift, read and write of data at all the addresses of the dual port RAM 11 can be made.

Thus, by forming the address inputting circuit 13 of the inverting circuits provided by the EX-OR gate 14 and the EX-NOR gate 15 and supplying, through the address inputting circuit 13, the M-sequence pattern data and their inverted pattern data to the scan registers $12_{a1}$–$12_{a3}$, $12_{b1}$–$12_{b3}$ on both the ports A and B, the address inputs AA0–AA2 and BA0–BA2 to both the ports A and B are caused to have a bit-inverse relationship to each other at all times. Accordingly, it does not occur that address inputs to the ports A and B become the same.

Further, since to which of the port A and the port B the inverted pattern data will be supplied can be controlled by the address inverting signal $A_{INV}$, the address inputs to the ports A and B can be controlled or presumed.

Relationships among points of time, M-sequence data, data on the port A, and data on the port B in the case where the address inputs are formed of four inputs and four-degree M-sequence is shifted are shown in Table 1.

If Table 1 is seen reversely from the side of the address, we obtain relationships as shown in Table 2.

If, further, Table 2 is rearranged according to the order of writing, it is known that writing in the order A→B and writing in the order B→A take place evenly at all times as shown in Table 3.

Therefore, by making a change, with the use of the address inverting signal $A_{INV}$ in the address inputting circuit 13, as to whether the port A or the port B should be supplied with the inverted pattern data, addressing from the port A and the port B can be reversed. Consequently, writing in the order A→B and writing in the order B→A can be realized to all of the addresses.

At the data input side of the port A of the dual port RAM 11, there are arranged for example three, serially connected scan registers (B2) $16_{a1}$–$16_{a3}$ as a second group of scan registers corresponding to the input node, and the outputs of the scan registers (B2) $16_{a1}$–$16_{a3}$ provide the data inputs AI0–AI2, respectively, on the port A of the dual port RAM 11.

Likewise, at the data input side of the port B, there are arranged three, serially connected scan registers (B2) $16_{b1}$–$16_{b3}$ as the second group of scan registers corresponding to the input node, and the outputs of the scan registers (B2) $16_{b1}$–$16_{b3}$ provide the data inputs BI0–BI2, respectively, on the port B of the dual port RAM 11.

Figure 6:
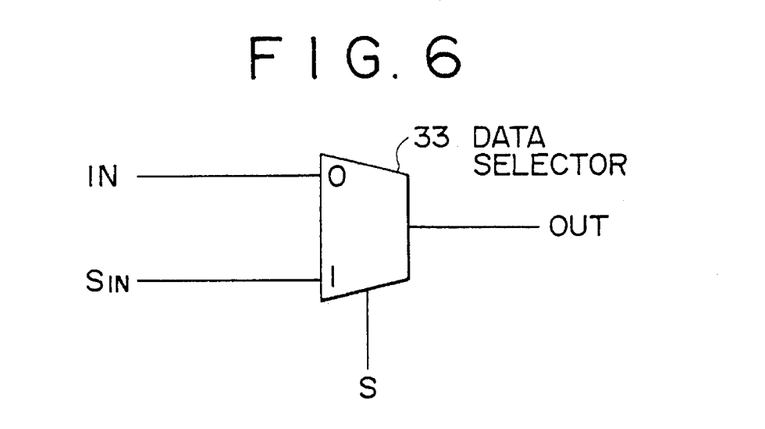
FIG. 6 is a block diagram showing an example of a particular structure of a scan register (B2) for use in a dual port RAM as a third embodiment of the invention.

The scan registers (B2) $16_{a1}$–$16_{a3}$, $16_{b1}$–$16_{b3}$, as shown in FIG. 6, are each constituted of a data selector 33 selecting either the scan input $S_{IN}$ or the data input IN according to the operation mode established based on the select signal S. In the normal operation mode (S=0), they select the data input IN, which serves as data inputs AI0–AI2, BI0–BI2 of the dual port RAM 11.

On the other hand, in the test operation mode (S=1), the scan registers $16_{a1}$–$16_{a3}$, $16_{b1}$–$16_{b3}$ function as a series of shift registers, which sequentially shifts the M-sequence pattern data or their inverted pattern data, input, as the scan inputs $S_{IN}$, through a data inputting circuit 17 (17a, 17b) to thereby provide the data inputs AI0–AI2, BI0–BI2.

The data inputting circuit 17 (17a, 17b) is made up of an EX-OR gate 18 receiving the M-sequence pattern data or their inverted pattern data and a data inverting signal $I_{INV}$ as two inputs thereto, an EX-NOR gate 19 receiving a checkerboard mode signal CB and the data inverting signal $I_{INV}$ as two inputs thereto, and an EX-OR gate 20 receiving the M-sequence pattern data or their inverted pattern data derived as the output of the scan registers $12_{b2}$ in the second stage at the side of the port B and the output of the EX-NOR gate 19 as two inputs thereto.

The EX-OR gate 18 functions as a buffer when the data inverting signal $I_{INV}$ is "0" and functions as an inverter when the data inverting signal $I_{INV}$ is "1".

On the other hand, the EX-OR gate 20, in a random mode established by the checkerboard mode signal CB going to "0", functions as an inverter when the data inverting signal $I_{INV}$ is "0" and functions as a buffer when the data inverting signal $I_{INV}$ is "1".

Further, the EX-OR gate 20, in a checkerboard mode established by the checkerboard mode signal CB going to "1", functions as a buffer when the data inverting signal $I_{INV}$ is "0" and functions as an inverter when the data inverting signal $I_{INV}$ is "1".

Therefore, in the random data mode as a first mode, the M-sequence pattern data become the data inputs AI0–AI2 on the port A and their inverted pattern data become the data inputs BI0–BI2 on the port B when the data inverting signal $I_{INV}$ is "0". Whereas, the inverted pattern data become the data inputs AI0–AI2 on the port A and the M-sequence pattern data become the data inputs BI0–BI2 on the port B when the data inverting signal $I_{INV}$ is "1".

On the other hand, in the checkerboard mode as a second mode, the M-sequence pattern data become the data inputs AI0–AI2, BI0–BI2 on the ports A and B when the data inverting signal $I_{INV}$ is "0", whereas their inverted pattern data become the data inputs AI0–AI2, BI0–BI2 on the ports A and B when the data inverting signal $I_{INV}$ is "1".

Relationships between each of the modes and the data inputs AI0–AI2, BI0–BI2 on the ports A and B are shown in Table 4.

Namely, according to the data inputting circuit 17 (17a, 17b), in the random data mode as the first mode, data written from the port A and data written from the port B are inverted from each other, such that "1" is written from the port B when "0" is written from the port A, and "0" is written from the port B when "1" is written from the port A. By such switchover of the data inputs and by the earlier described switchover of the address inputs, totally four times of write/read are made and, thereby, it is made possible to write/read "0" and "1" from the ports A and B to and from all the addresses.

Further, in the checkerboard mode as the second mode, the same data are written from both the port A and the port B. In the present example, the address input is structured of three bits and the data input is adapted to be derived from its second bit. Accordingly, "0" is written to the address 0(00) and the address 1(01), "1" is written to the address 2(10) and the address 2(10) and the address 3(11), . . . .

In consequence, regardless of the order of writing, it is made possible to write the checkerboard pattern data to the whole address space of the dual port RAM 11 and read out the same.

In an actual test, the test is carried out first in the random data mode and then in the checkerboard mode. The test sequence is shown in Table 5.

Referring to Table 5, "A" denotes the input data on the port A being the M-sequence pattern data, "A inverted" denotes the input data on the port A being the inverted pattern data of the M-sequence pattern data, "B" denotes the input data on the port B being the M-sequence pattern data, and "B inverted" denotes the input data on the port B being the inverted pattern data of the M-sequence pattern data.

However, the checkerboard test of the sequence numbers 11 and 12 can be omitted unless specially high reliability is required. Consequently, the test can be generally performed by using the patterns ⅚ times as large in number as that used with the test of the single port RAM of the equivalent size.

At the data output side of the dual port RAM 11, as with the data input side, there are arranged also three each of scan registers (B3) $21_{a1}$–$21_{a3}$, $21_{b1}$–$21_{b3}$, which are serially connected at their respective ports, as a third group of scan registers corresponding to the output node. Further, the scan registers on the port A and those on the port B are serially connected in the order port A→port B.

Figure 7:
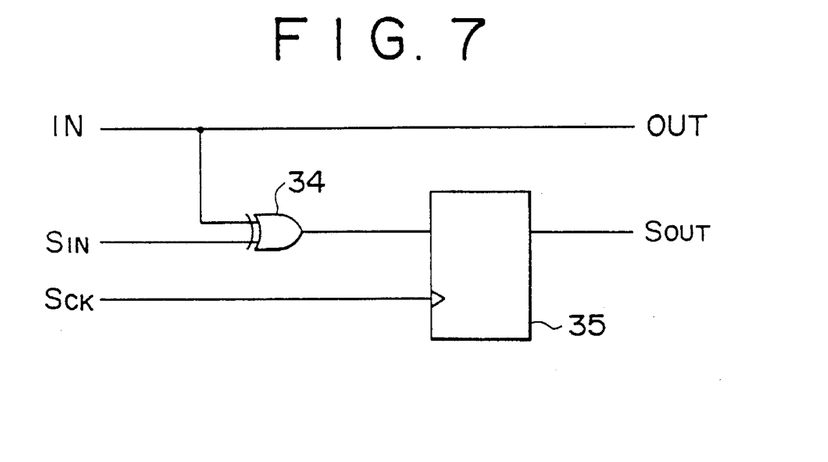
FIG. 7 is a block diagram showing an example of a particular structure of a scan register (B3) for use in a dual port RAM as a fourth embodiment of the invention.

The scan registers (B3) $21_{a1}$–$21_{a3}$, $21_{b1}$–$21_{b3}$ are each made up, as shown in FIG. 7, of an EX-OR gate 34 receiving the M-sequence pattern data supplied from a data selector 22 as the scan input $S_{IN}$ and the data input IN as two inputs thereto and a flip-flop circuit 35 latching the output of the EX-OR gate 34 in synchronism with the shift clock $S_{CK}$, and the same outputs either the data input IN as it is as the data output OUT or the output of the flip-flop 35 as the scan output $S_{OUT}$.

The data selector 22, when the address inverting signal $A_{INV}$ is "0", selects output data of the scan registers $12_{a3}$ at the third stage of the port A at the address input side and, when the address inverting signal $A_{INV}$ is "1", selects output data of the scan registers $12_{b3}$ at the third stage of the port B.

As a result, when the address inverting signal $A_{INV}$ is "0", the M-sequence pattern data passed through the scan registers $12_{a1}$–$12_{a3}$ on the port A at the data input side, and when the address inverting signal $A_{INV}$ is "1", the M-sequence pattern data passed through the scan registers $12_{b1}$–$12_{b3}$ on the port B, are supplied to the scan registers $21_{a1}$–$21_{a3}$, $21_{b1}$–$21_{b3}$ at the data output side.

Thus, by selecting the shift path by means of the selector 22 at the final stage of both the ports A and B, the input M-sequence pattern data can be output as they are at all times.

Thereby, in the case where there are a plurality of ROM/RAM within a chip, their testing circuits can be linked together such that the address testing circuits are connected in the first place, the data input testing circuits in the next place, and the data output testing circuits in the last place.

It can also be confirmed whether the test circuits for each of the port A and the port B are making a correct shifting operation by causing the shifting operation to be made with the data selector 22 switched over.

In the embedded testing circuit of the dual port RAM 11, as described above, the address inputs to both of the ports A and B do not become the same and, in addition, the address inputs to both the ports A and B are controllable, and, further, write of "0" and "1" from both of the ports is possible by the data inputting circuit 17. Therefore, simultaneous write/simultaneous read test of the dual port RAM 11 can be effectively achieved with a short test pattern employing for example the M-sequence.

Figure 8:
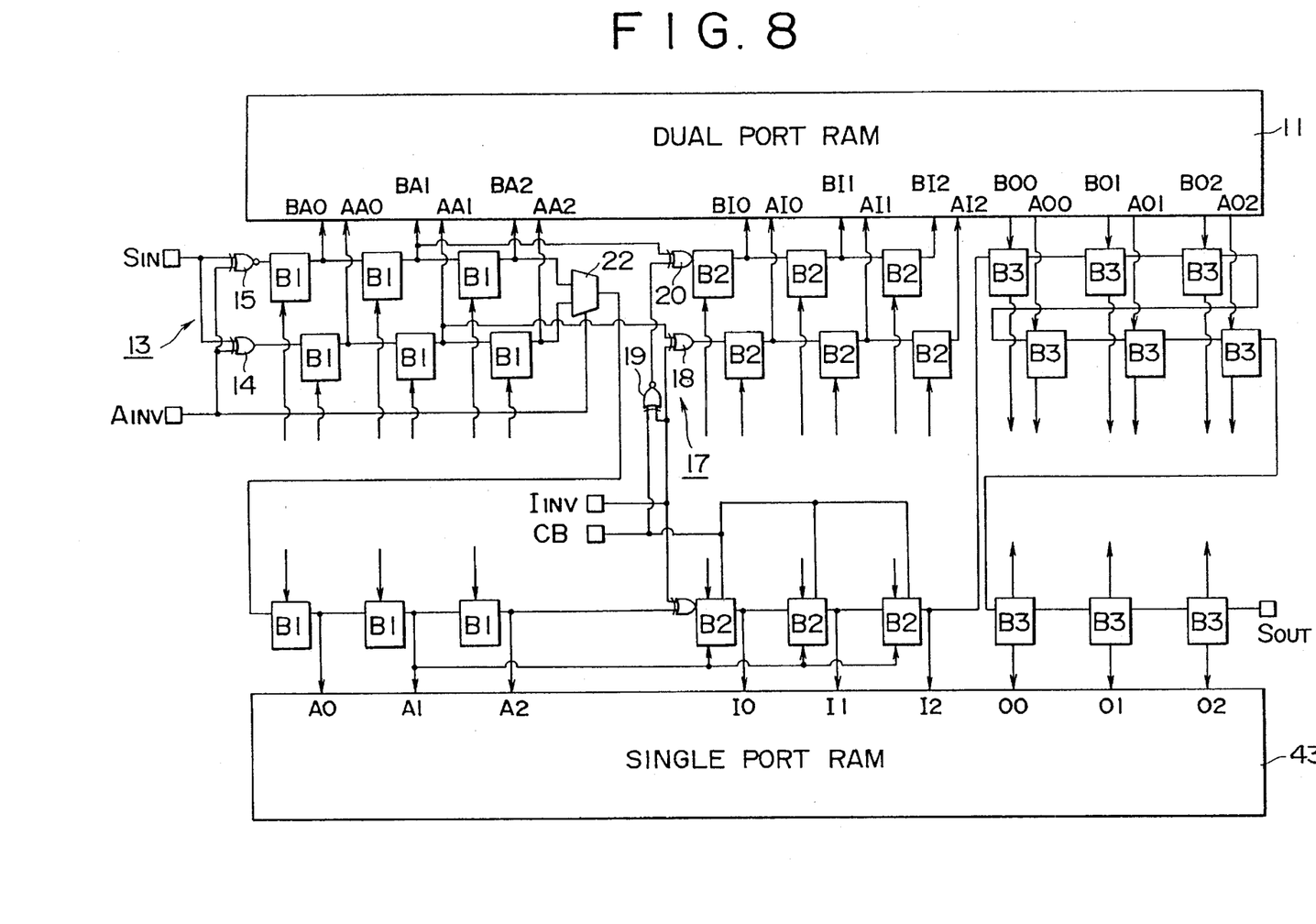
FIG. 8 is a block diagram showing a dual port RAM as a fifth embodiment of the invention.

Further, according to the embedded test circuit of the described structure, it can be used in a state mixed with the conventional testing circuit of a single port RAM 43 as shown in FIG. 8.

Parts in FIG. 8 corresponding to those in FIG. 4 are denoted by corresponding reference numerals. As the pattern data to be supplied to the address input side of the single port RAM 43 after being passed through the address input side of the dual port RAM 11, the M-sequence pattern data are selected by the data selector 22 at all times.

Then, the M-sequence pattern data passed through the address input side of the single port RAM 43 are supplied to the data input side of the single port RAM 43. Then, the data are connected to be supplied to the data output side of the single port RAM 43 through both the ports A and B at the data output side of the dual port RAM 11.

In the invention, as described above, there is provided an address inputting circuit selectively supplying predetermined pattern data or their inverted pattern data to the group of scan registers on the port A at the address input side and also selectively supplying the inverted pattern data or the predetermined pattern data to the group of scan registers on the port B. Accordingly, the address inputs to both the ports A and B have a bit-inverse relationship to each other at all times and, hence, the address inputs on both ports do not become the same. Since, further, address inputs to both the port A and the port B can be controlled or presumed, simultaneous write/simultaneous read test of the dual port memory can be effectively achieved using a short test pattern.

Further, since there is provided a data inputting circuit selectively supplying the predetermined pattern data or their inverted pattern data passed through the group of scan registers on the port A at the address input side to the group of scan registers on the port A at the data input side and also selectively supplying the inverted data or the predetermined pattern data passed through the group of scan registers on the port B at the address input side to the group of scan registers on the port B at the data input side, the data written from the port A and the data written from the port B are always in inverse relationship to each other. Accordingly, it is possible to write and read "0" and "1" to or from all addresses, from both of the ports A and B.

Further, in the checkerboard mode, since the data inputting circuit selectively supplies the predetermined pattern data or their inverted pattern data passed through the group of scan registers on the port B at the address input side to the scan register group on the port B at the data input side, the same data can be written from both the port A and the port B. As a result, it is made possible to write and read the checkerboard pattern data to and from all of the address space regardless of the order of writing.

What is claimed is:

1. An embedded testing circuit of a dual port memory embedded in a semiconductor integrated circuit together with a dual port memory for testing the memory comprising:

a first group of scan registers formed of serially connected plural stages of scan registers provided on each port at the address input side of said dual port memory corresponding to each node;

an address inputting circuit for selectively supplying predetermined pattern data or their inverted pattern data to one port side of said first group of scan registers and the other of said inverted pattern data or said predetermined pattern data to the other port side of said first group of scan registers;

a second group of scan registers formed of serially connected plural stages of scan registers provided on each port at the data input side of said dual port memory corresponding to each node; and a data inputting circuit for selectively supplying said predetermined pattern data or said inverted pattern data passed through the one port side of said first group of scan registers to the one port side of said second group of scan registers and selectively supplying, in a first mode, said inverted pattern data or said predetermined pattern data passed through the other port side of said first group of scan registers, and, in a second mode, said predetermined pattern data or said inverted pattern data passed through the other port side of said first group of scan registers, to the other port side of said second group of scan registers, wherein in said first mode, data written from a port A and data written from a port B are always held in inverse relationship to each other; and wherein in said second mode, the same data can be written from port A and port B.

2. An embedded testing circuit of a dual port memory according to claim 1, wherein said data inputting circuit derives said predetermined pattern data or said inverted pattern data from an intermediate one of the stages of said first group of scan registers.

3. An embedded testing circuit of a dual port memory according to claim 1, further comprising:

a third group of scan registers formed of serially connected plural stages of scan registers provided on each port at the data output side of said dual port memory corresponding to each node, the portions thereof on both ports being serially connected; and a data selector selecting said predetermined pattern data passed through either port side of said first group of scan registers and supplying the selected data to said third group of scan registers.

4. An embedded testing circuit of a dual port memory according to claim 1, wherein an M-sequence pattern is used as said pattern.

5. An embedded testing circuit of a dual port memory embedded in a semiconductor integrated circuit together with a dual port memory for testing the memory comprising:

a first group of scan registers formed of serially connected plural stages of scan registers provided on each port at the address input side of said dual port memory corresponding to each node;

an address inputting circuit for selectively supplying predetermined pattern data or their inverted pattern data to one port side of said first group of scan registers and the other of said inverted pattern data or said predetermined pattern data to the other port side of said first group of scan registers;

a second group of scan registers formed of serially connected plural stages of scan registers provided on each port at the data input side of said dual port memory corresponding to each node; and a data inputting circuit for selectively supplying said predetermined pattern data or said inverted pattern data passed through the one port side of said first group of scan registers to the one port side of said second group of scan registers and selectively supplying, in a random data mode, said inverted pattern data or said predetermined pattern data passed through the other port side of said first group of scan registers, and, in a checkerboard mode, said predetermined pattern data or said inverted pattern data passed through the other port side of said first group of scan registers, to the other port side of said second group of scan registers, wherein in said random data mode, data written from a port A and data written from a port B are always held in inverse relationship to each other; and wherein in said checkerboard mode, the same data can be written from port A and port B.

6. An embedded testing circuit of a dual port memory according to claim 5, wherein said data inputting circuit derives said predetermined pattern data or said inverted pattern data from an intermediate one of the stages of said first group of scan registers.

7. An embedded testing circuit of a dual port memory according to claim 5, further comprising:

a third group of scan registers formed of serially connected plural stages of scan registers provided on each port at the data output side of said dual port memory corresponding to each node, the portions thereof on both ports being serially connected; and a data selector selecting said predetermined pattern data passed through either port side of said first group of scan registers and supplying the selected data to said third group of scan registers.

8. An embedded testing circuit of a dual port memory according to claim 5, wherein an M-sequence pattern is used as said pattern.

* * * * *